United States Patent
Guy et al.

(10) Patent No.: US 11,137,422 B2
(45) Date of Patent: Oct. 5, 2021

(54) SYSTEM AND METHOD FOR MONITORING VOLTAGE IN A CABLE

(71) Applicant: RF Code, Inc., Austin, TX (US)

(72) Inventors: Jonathan Andrew Guy, Austin, TX (US); Jacob Aaron Perlmutter, Austin, TX (US); Iurii Buiankin, Austin, TX (US)

(73) Assignee: RF Code, Inc., Austin, TX (US)

( * ) Notice: Subject to any disclaimer, the term of this patent is extended or adjusted under 35 U.S.C. 154(b) by 57 days.

(21) Appl. No.: 16/701,963

(22) Filed: Dec. 3, 2019

(65) Prior Publication Data

US 2020/0182911 A1      Jun. 11, 2020

Related U.S. Application Data

(60) Provisional application No. 62/774,834, filed on Dec. 3, 2018.

(51) Int. Cl.
*G01R 15/14* (2006.01)
*G01R 29/08* (2006.01)
*G01R 19/155* (2006.01)

(52) U.S. Cl.
CPC ......... *G01R 15/148* (2013.01); *G01R 19/155* (2013.01); *G01R 29/0878* (2013.01)

(58) Field of Classification Search
CPC .............. G02B 21/0032; G01R 19/155; G01R 15/148; G01R 29/085; G01R 29/0878; G01R 31/3644; G01R 31/396; G01R 33/02; H05K 1/181; H05K 2201/10151; H05K 2201/10356; H05K 7/1427; H01B 1/22; H02J 15/00; H02J 2007/0067; H02J 7/0047; H02J 7/00712; H05H 2001/4637

See application file for complete search history.

(56) References Cited

U.S. PATENT DOCUMENTS 6,236,218 B1 *  5/2001  Johansson .......... G01R 31/1209
                                                       324/536
8,937,480 B2 *  1/2015  Tabuchi ............... H05H 1/0081
                                                       324/686

(Continued)

FOREIGN PATENT DOCUMENTS

DE       102012214394 A1      2/2014

OTHER PUBLICATIONS

ISA/US, International Search Report and Written Opinion of the International Searching Authority, International Application No. PCT/US2019/064253, dated Mar. 5, 2020, 12 pages.

*Primary Examiner* — Vinh P Nguyen

(57) ABSTRACT

A sensor device for detecting voltage in a conductor cable includes a sense electrode to be disposed over a surface of the conductor cable to cover a sense region having a sense axial width and a sense circumferential length and a reference electrode to be disposed over the surface of the conductor cable to cover a reference region. The reference region has an axial position adjacent the axial position of the sense region and has a reference circumferential length greater than the sense circumferential length. The sensor device further includes a charge measurement circuit connected in series between the sense electrode and the reference electrode to measure a charge measurement and circuitry to compare the charge measurement to a threshold to detect a presence of the voltage in the conductor cable.

21 Claims, 7 Drawing Sheets

(56) References Cited

U.S. PATENT DOCUMENTS

| | | |
|---|---|---|
| 9,460,832 B2 | 10/2016 | Gravermann et al. |
| 9,739,820 B2 | 8/2017 | Gravermann et al. |
| 2014/0368221 A1* | 12/2014 | Weinmann ............. G01R 15/16 |
| | | 324/658 |
| 2017/0363660 A1 | 12/2017 | Gravermann |

* cited by examiner

SYSTEM AND METHOD FOR MONITORING VOLTAGE IN A CABLE

CROSS-REFERENCE TO RELATED APPLICATION(S)

This application claims benefit of U.S. Provisional Application No. 62/774,834, filed Dec. 3, 2018, which is incorporated herein by reference in its entirety.

BACKGROUND

Society's increasing reliance on electric power has resulted in an ever-increasing complexity of electric systems. With the emergence of electric appliances, electric vehicles, and electronics, consumers and businesses are interconnected in ways that were previously isolated. As such, disruptions to services can create massive, cascading consequences. Moreover, companies and consumers are relying on the presence of electric power to operate sensitive, or even lifesaving, technologies.

One concern arising from consumer and business dependence on electrical and electronic equipment, is power failure. In complex or remote systems, partial or complete power failure may be difficult to distinguish from other system failures. Communication to the equipment and to adjacent personnel may be partially or fully compromised by loss of power, so an independent means of detecting the presence of power is desired.

Detection of power failure has previously been accomplished by placing in-line voltage sensors or with the use of magnetic-field-based current sensors. In-line voltage sensors are complicated to install and generally require interruption of power when installed. Magnetic field based current sensors rely on the flow of current through the power cables and can be unreliable when little or no current is being drawn.

BRIEF DESCRIPTION OF THE DRAWINGS

The present disclosure may be better understood, and its numerous features and advantages made apparent to those skilled in the art by referencing the accompanying drawings.

The use of the same reference symbols in different drawings indicates similar or identical items.

DETAILED DESCRIPTION

FIGS. 1-8 illustrate embodiments of a voltage sensor device. The voltage sensor device can be used to monitor voltage in a power cable, such as AC voltage in a multi-conductor power cable. The sensor device can include sense electrodes that wrap around unshielded power cable and circuitry to provide real-time indications that the cable is live. The sensor device can communicate wirelessly the voltage status of the cable. For example, the sensor device can be battery-powered and attach around a power cord or cable going in or out of an electrical appliance. No electrical contact is utilized with the power cable, and installation does not utilize unplugging or powering down the equipment. Once installed, the sensor device reports any change in the presence of voltage, providing wireless alerts or trigger events over a radio link. In particular, the sensor device detects electric fields (E-field) around the cable and does not utilize direct electrical connection with conductors of the cable. Accordingly, the sensor device is isolated from the electric power in the cable and provides a safe and reliable system.

In some embodiments, the sensor device detects the presence or absence of a voltage, such as an AC voltage, by measuring the E-field of the conductor. The E-field exists whenever voltage (AC or DC) is present, unlike a magnetic field which only exists in a conductor when current is flowing.

Figure 1:
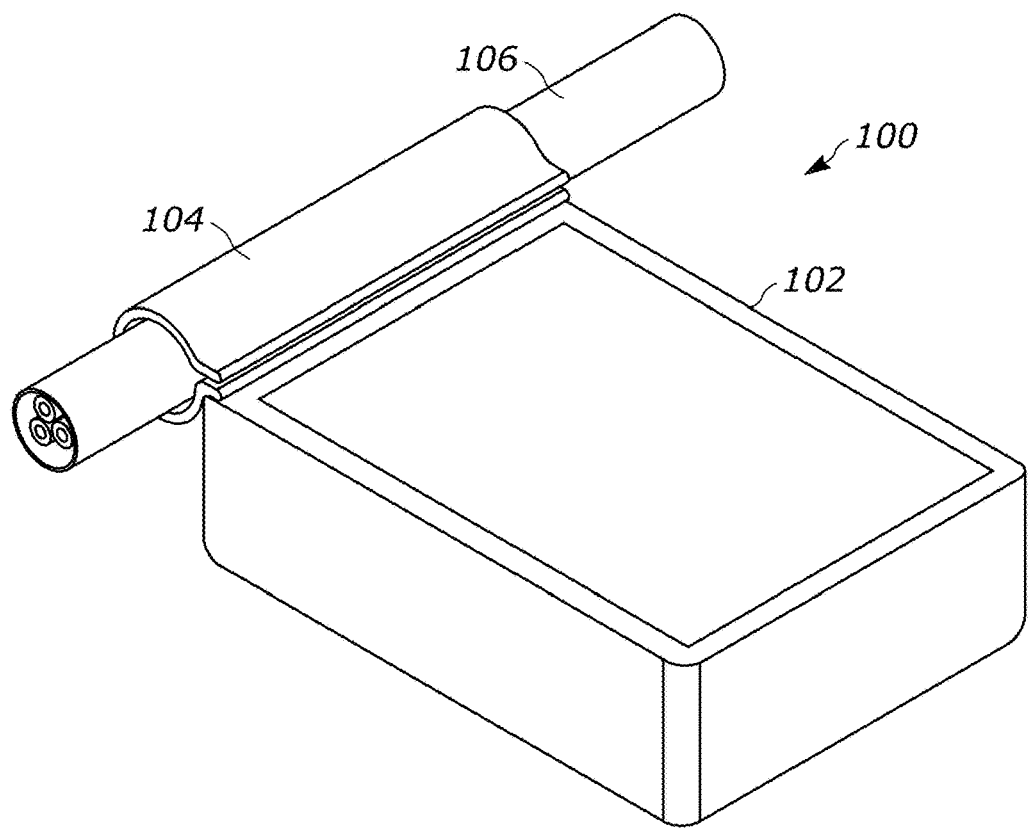
FIG. 1 includes an illustration of an example sensor device.

FIG. 1 includes an illustration of an exemplary sensor device 100 to detect the presence or absence of voltage in a cable 106. A set of sense electrodes is disposed in a clip or strap 104 wrapped around the cable 106. The set of electrodes are electrically connected to circuitry within the housing 102. The circuitry detects the presence or absence of voltage using field-based detection and can report the absence or presence of voltage using a wireless link.

Figure 2:
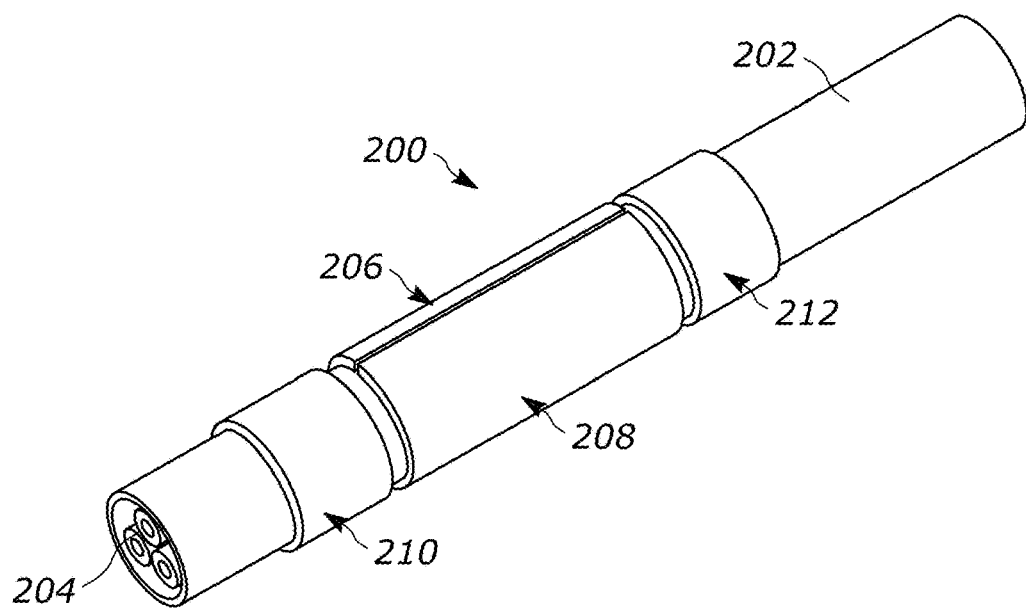
FIG. 2 includes an illustration of an example configuration of electrodes for use by the sensor device of FIG. 1.

FIG. 2 includes an illustration of an example electrode configuration. A cable 202 can include multiple conductors 204, each of which are insulated individually. In an example, one conductor can be a live conductor, another conductor can be a neutral conductor, and a further conductor can be a ground conductor.

Figure 9:
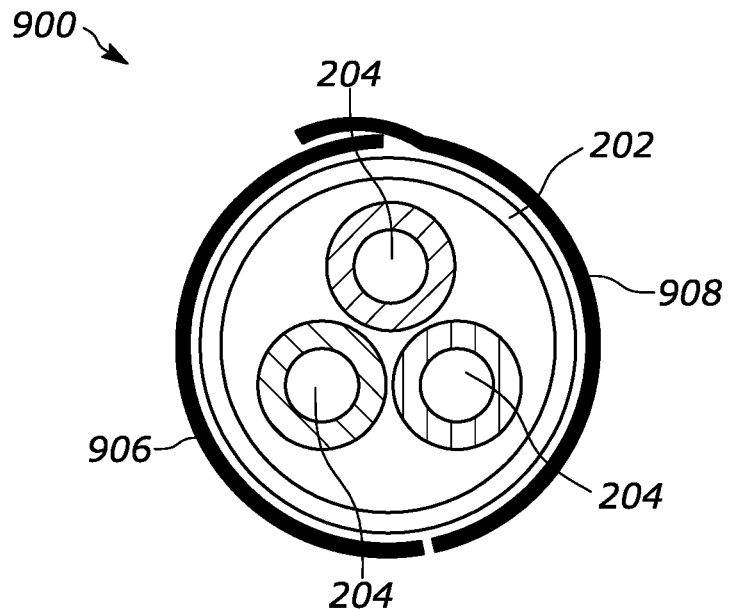
FIG. 9 illustrates an example configuration showing overlapping sense electrodes.

The electrode configuration 200 includes at least one sense electrode. For example, the sense electrode 206 that extends over a region on the surface of the cable 202. The configuration 200 can also include a sense electrode 208 that extends over a region of the surface of the cable 202. The sense electrode 206 and the sense electrode 208 have the same or similar axial position relative to the cable 202 and as such, are aligned at the axial position. The sense electrode 206 and the sense electrode 208 are offset circumferentially or angularly and thus, are adjacent in circumferential position. As illustrated, the sense electrodes 206 and 208 have an axial width extending along the axis of the cable 202 and have a circumferential length extending along the circumference of the cable 202. In an example, the sense electrodes 206 and 208 can have approximately the same axial width and circumferential length. In an example, the sense electrodes do not overlap. In an alternative example, the sense electrodes overlap, as illustrated in FIG. 9 (showing a cross-sectional view for clarity) which shows an example configuration 900 with sense electrode 908 overlapping sense electrode 906. Further, the sense electrodes may or may not extend more than the circumference of the cable 202.

The configuration 200 also includes a reference electrode 210 and optionally a reference electrode 212. The reference electrodes 210 or 212 are positioned at an axial position relative to the axis of the cable 202 adjacent the axial position of the sense electrodes 206 and 208. The reference electrode 210 or 212 can extend around the circumference of the cable, for example, extending at least the circumferential length of both of the sense electrodes 206 and 208. The reference electrode 212 can be positioned at an axial position on an opposite side of the axial position of the reference electrode 210 relative to the sense electrodes 206 and 208.

When a conductor 204 of the cable 202 carries a voltage, the difference in the circumferential length covered by a sense electrode and the circumferential length covered by the reference electrode leads to a charge difference between the sense electrode and the reference electrode. When a charge measurement circuit is connected in series between the sense electrode and the reference electrode, a charge can be measured that indicates the presence of the voltage in the conductor 204.

The charge measurement circuit may be an ammeter capable of measuring the current in amperes resulting from the charge differential. The charge measurement circuit may be a voltmeter connected in series between the sense electrode and the reference electrode. The charge measurement circuit may substantially preserve the charge between the sense electrode and the reference electrode, allowing the charge to decay due to the environment or instantaneous conductor voltage. Alternatively, where charge measurement is made using a voltmeter or ammeter, the resistance of the meter provides a decay path.

Figure 3:
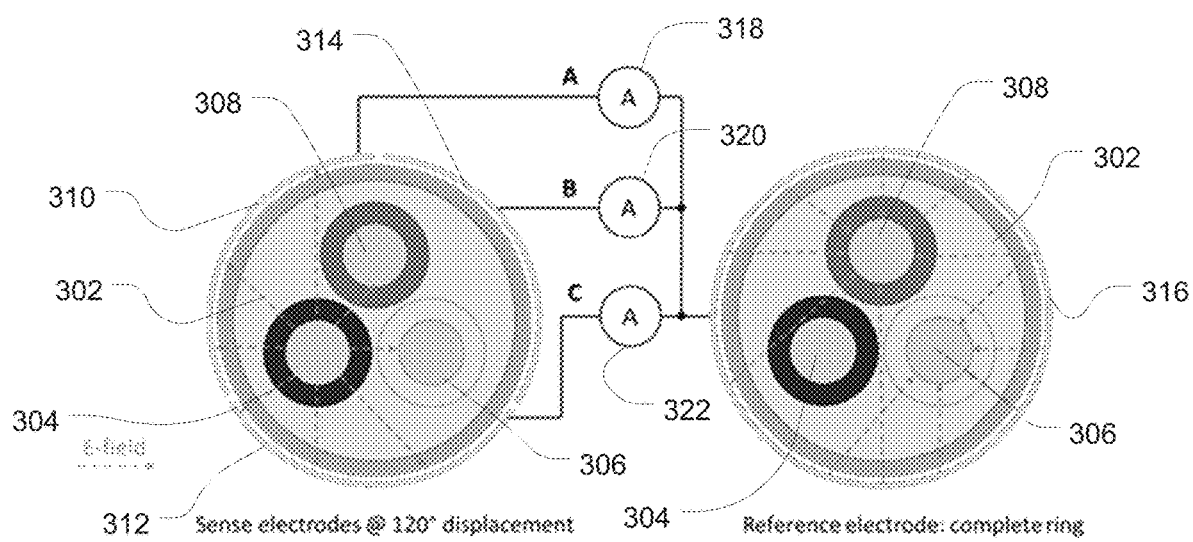
FIG. 3 includes an illustration of example electrode configurations and circuitry for detecting power in a conductor cable.

FIG. 3 includes an illustration of circuitry for detecting the absence or presence of voltage in a conductor cable. A conductor cable 302 can include one or more conductors, such as conductors 304, 306, and 308. In an example, the conductor 304 is a live conductor, the connector 306 is a neutral conductor, and the conductor 308 is a ground conductor. Each of the conductors 304, 306, and 308 can be individually insulated.

Sense electrodes 310, 312, or 314 are distributed around the conductor cable 302. In the illustrated example, the electrodes 310, 312 and 314 are distributed at offsets of 120°. While the electrodes 310, 312, and 314 are illustrated as being evenly distributed around the conductor 302, electrodes may not extend around the full circumference of the conductor 302 or may extend more than once around the conductor 302, causing some overlap of the sense electrodes.

At a separate axial position, a reference electrode 316 can extend around the conductor 302. In the illustrated example, the reference electrode 316 extends around the full circumference of the conductor cable 302. Alternatively, the reference electrode 316 can extend partially around the circumference of the conductor cable 302 or can extend more than once around the circumference of the conductor cable 302, leading to overlap of the reference electrode 316 over itself. In general, the reference electrode 316 extends a greater circumferential length around the cable 302 than any one of the sense electrode 310, 312, and 314, which leads to a difference in charge between the reference electrode 316 and at least one of the sense electrodes 310, 312, or 314.

To measure the difference in charge, each of the sense electrodes 310, 312, and 314 are connected in series through separate ammeters 318, 320, or 322 to the reference electrode 316. The e-field of a live conductor results in a charge on each of the three sense electrodes 310, 312, or 314, which cause three electrical currents through the ammeters 318, 320, and 322 when connected in series to the reference electrode. The sense electrodes 310, 312, and 314 are connected to the reference electrode 316 in parallel relative to each other. The e-fields experienced by each of the sense electrodes 310, 312, or 314 are asymmetric, being influenced by the physical offset of the conductor, the shielding influence of the other conductors, the reinforcement cancellation of other e-fields, or the angular relationship between the conductors and the sense electrodes 310, 312, and 314. As such, current measurements by the ammeters 318, 320, and 322 are different. The current can be compared to a threshold to detect the presence of a live conductor.

The current measurements from the ammeters 318, 320, and 322 can be amplified and filtered and compared to a threshold. For example, the current measurements can be converted to an equivalent voltage, then applied to a simple voltage comparator with a fixed or adjustable reference or can be fed to an analog-to-digital converter for measurement by digital circuit or microprocessor. For on-off voltage detection, the peak measurement can be compared to a reference threshold. Alternatively, the absolute product of the measurements can be used for more dynamic range in the measurement. In an example, the sum of the peaks of the current measurements can be used to determine the presence of voltage in the cable. The electrode-and-sense configuration enables a sensor that can detect voltage independent of the sensor's position on the cable. A device can mount on the cable in a convenient manner, and mounting can include clamps, clips, or straps, a combination thereof, or other means.

The electric configuration establishes a reference and uses multiple sensor electrodes to exploit asymmetry in the cable for measuring the e-fields. The reference electrodes compensate for a lack of ground reference. In particular, the sensor device is a battery-powered wireless device with no external electrical connections and in particular, lacks a connection to the ground.

Figure 10:
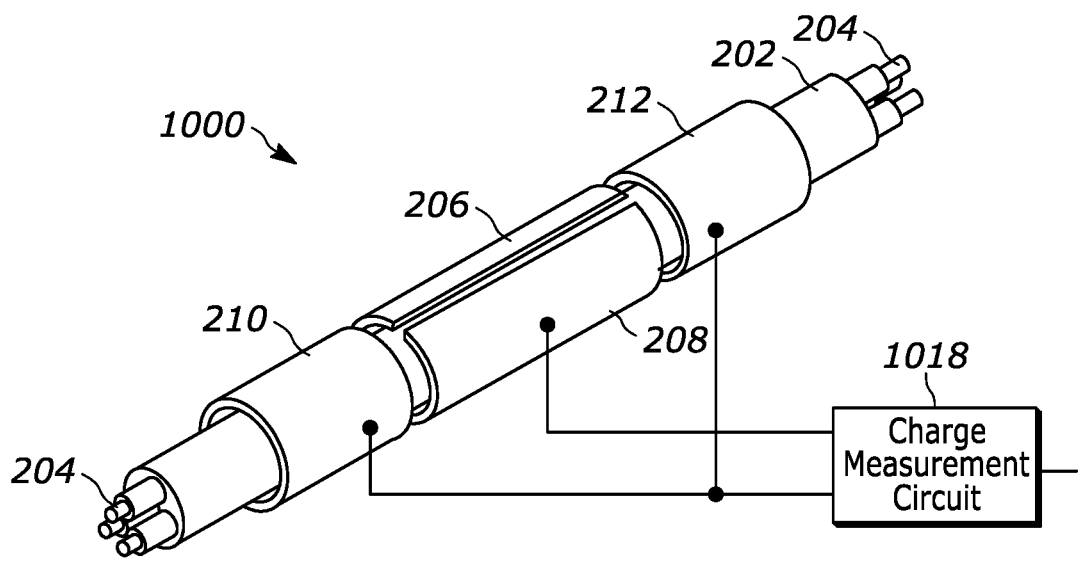
FIG. 10 illustrates an example configuration showing two reference electrodes that are connected together.

A single reference electrode can be used. Alternatively, additional reference electrodes can be used. For example, a two-reference electrode configuration can be used in which the reference electrodes are located on either axial side of the sense electrodes. The reference electrodes can be electrically coupled, providing an averaging of the reference level over the width of the sensor. Such a configuration is beneficial in cables where the relationship between the sensor and the conductor shifts due to imprecision in the overmolding of the cable jacket. An example configuration 1000 having two reference electrodes 210, 212 connected together is illustrated in FIG. 10, which also shows two sense electrodes 206, 208 and a charge measurement circuit 1018.

Figure 4:
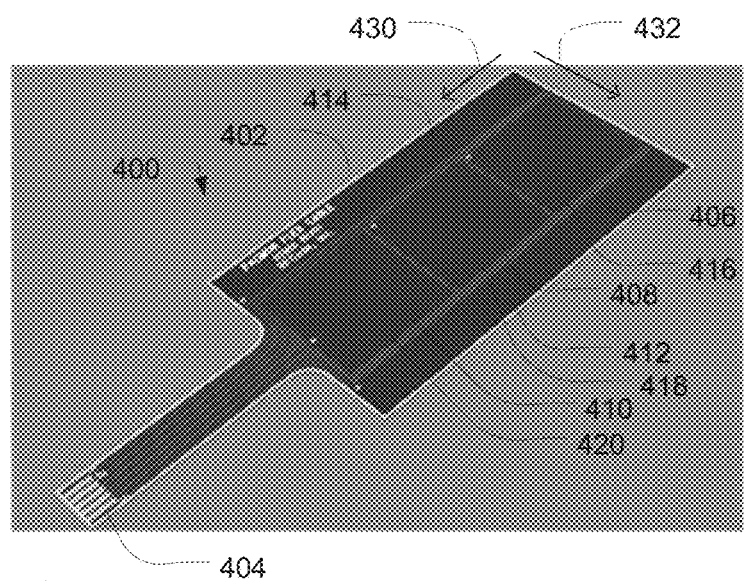
FIG. 4 includes an illustration of an example configuration of electrodes on a flexible substrate.

In an example, the electrodes can be configured on a flexible substrate, so the electrodes can be wrapped around a cable. For example, FIG. 4 illustrates a flexible electrode configuration 400 in which electrodes are disposed on a flexible substrate 402 and are electrically connected to an electrical coupling 404 to interface with other circuitry. In the illustrated example, flexible substrate includes sense electrodes 406, 408 and 410, each positioned at an offset to relative to a dimension 430 that when wrapped around the cable becomes a circumference of the cable. Reference electrodes 412 and 414 are positioned on either axial side of the set of sense electrodes 406, 408 and 410, wherein the dimension 432 becomes an axial dimension when the substrate is wrapped around the cable. In the illustrated example, the reference electrodes 410 or 412 extend in the circumferential dimension along the circumferential length of the sense electrodes 406, 408, and 410. Further, the reference electrodes 412 and 414 are illustrated as having a smaller axial width than the sense electrodes 406, 408, and 410.

Further, the substrate may form an electrostatic discharge (ESD) structure having a conductor with a gap extending between the reference electrodes and the sense electrodes.

For example, ESD structures 416, 418, and 420 are formed between a sense electrode (406, 408, or 410) and a reference electrode (412 or 414).

Figure 5:
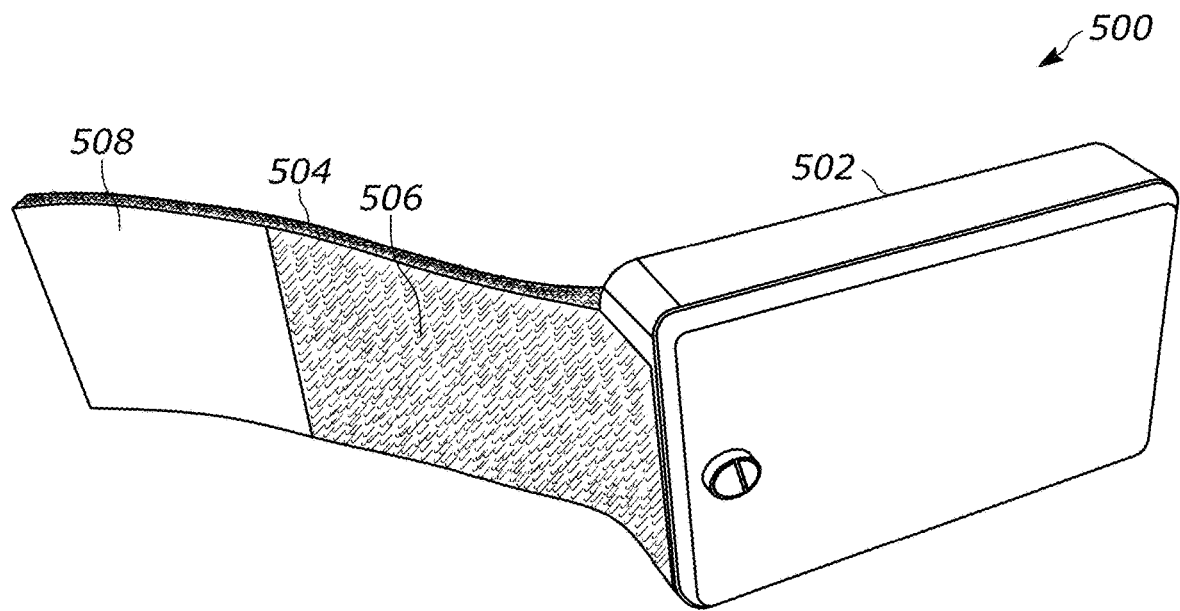
FIG. 5 and FIG. 6 include illustrations of an example sensor device.
Figure 6:
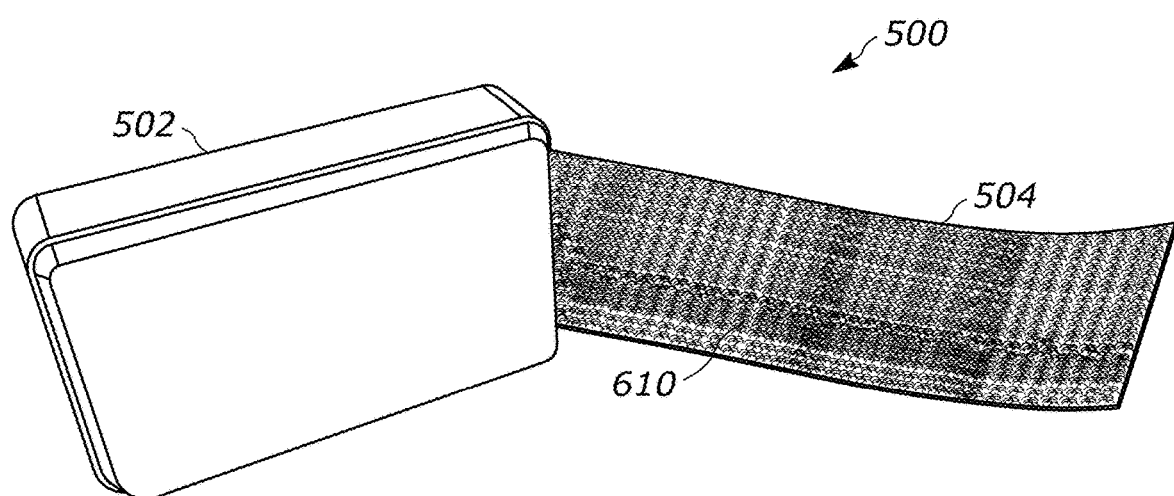

The reference electrodes and associated circuitry can be incorporated into a strap and housing configuration. For example, as illustrated in FIG. 5 and FIG. 6, a sensor device 500 includes a housing 502 incorporating a measurement circuitry connected to a strap 504 incorporating the sense and reference electrodes. In the illustrated example, the strap 504 includes an adhesive region 508 incorporating the sense and reference electrodes which can be adhesively coupled around a cable. Optionally, the strap 504 further includes a hook and loop attachment system in which the hooks 506 are attached on one side of the strap 504 and the loops 610 are attached on an opposite side of the strap 504 such that when the strap 504 is wrapped around a cable, the hooks and loops engage to further secure the sensor device 500 to the conductor cable.

Figure 7:
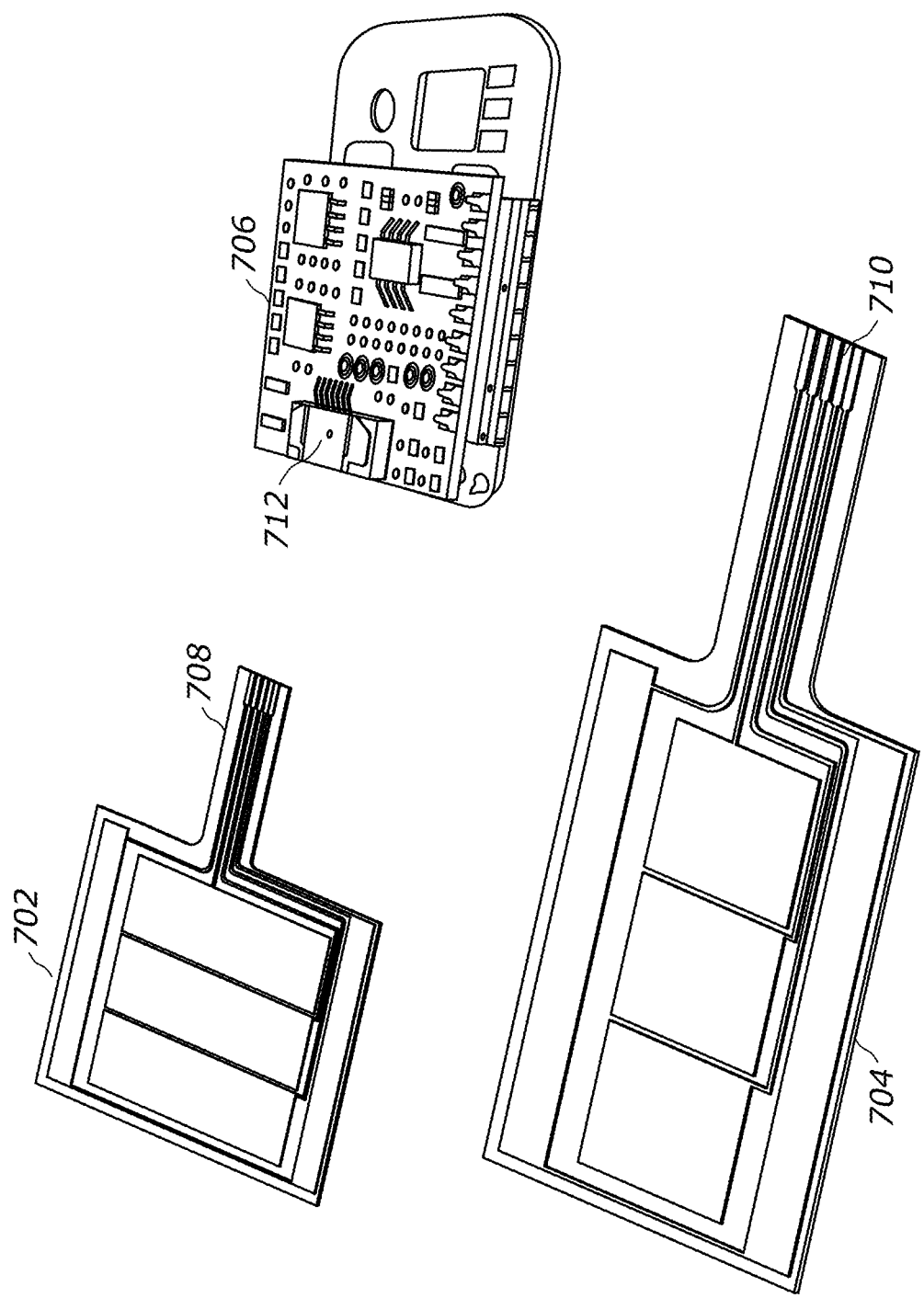
FIG. 7 illustrates example flexible electrode substrates and associated measurement circuitry.

FIG. 7 illustrates further configurations in which different sized electrode configuration 702 or 704 can be attached to circuitry 706. Electric interfaces 708 or 710 can be inserted into the electric interface 712 of the circuitry 706. As such, a single circuitry 706 can be used for smaller or larger cables and size of sense electrodes can be selected based on the size of the cable.

Figure 8:
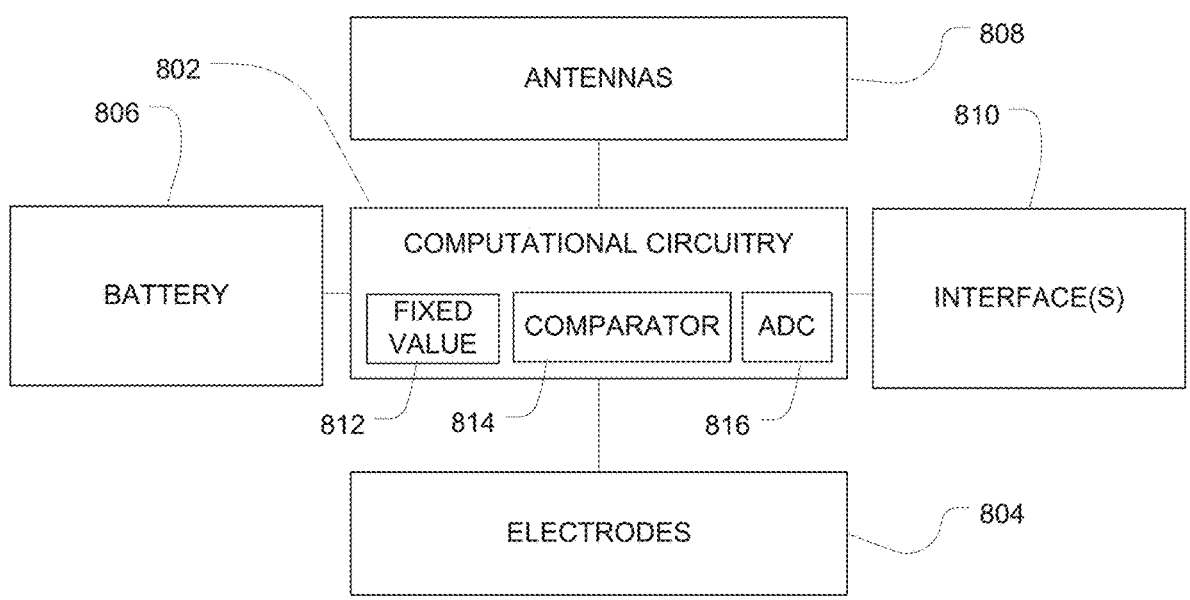
FIG. 8 includes a block diagram of an example sensor device.

FIG. 8 includes an illustration of exemplary circuitry 800 for implementing the sensor device. For example, the sensor device can include computational circuitry 802, which connects to compare input from sense and reference electrodes 804 to detect the presence or absence of voltage in a cable. The circuitry 802 can communicate the findings through a wireless connection using antennas 808. For example, the wireless connection can be a proprietary wireless connection or can be a wireless connection using a standard wireless interface, such as Bluetooth, Wi-Fi, or standard in compliance with IEEE 802.xx.

The circuitry 802 can be a powered, for example, using a battery 806. In a particular example, the circuitry is not connected to line power and is not grounded. Optionally, additional interfaces 810 can be provided to access the circuitry 802. Such interfaces can optionally include a USB interface or other hardwired interfaces.

In an example, the computational circuitry can include analog components or digital components. For example, the computational circuitry 802 can include a comparator 814 to compare aspects of a signal, such as a peak value or root mean square value, to a fixed value 812. In another example, the computational circuitry 802 can include an analog-to-digital converter 816 to provide digital signals that are further processed by microprocessors of the computational circuitry 802. Such processors can compare peak measurements to a reference threshold. In another example, such processors can utilize the absolute product of the measurements for more dynamic range in the measurement. In an example, the sum of the peaks of the current measurements can be used to determine the presence of voltage in the cable.

Embodiments of the above sensor device provide desirable technical advantages over prior art systems. The sensor device provides for simple on/off indication of available AC voltage and can generates alerts within 1 second of voltage failure. No electrical connection is utilized; an electrician is not required for installation. The sensor device connects around insulated (2,3,4 or more) conductor appliance cables, and does not access individual conductors. The design can be an ultra-low power design and use a coin cell battery that lasts up to 6 years. One design covers cables over a 2:1 diameter range (e g 6 mm to 12 mm diameter).

Further, the sensor device is capable of detecting an electric field (E-field) on a conductor even when the conductor is part of a cable containing multiple conductors. In some embodiments, the sensor reliably senses an E-field regardless of cable orientation (e.g., angular orientation). In some embodiments, the sensor is not adversely affected by the stray E-fields of nearby cables and equipment. In some embodiments, the sensor operates at extremely low power (less than 3 uA) including radio operation. In some embodiments, the sensor does not have a reference for ground in either conductor or human-body form. In some embodiments, the e-field sensor is field-attachable to a range of cable sizes. In some embodiments, the sensor amplifies very low-level signals representing the E-field. In some embodiments, the sensor attaches quickly without powering-down the equipment.

In some embodiments, the use of a flex circuit minimizes the spacing between the electrodes and the conductors and improves the ratio between the E-field being measured and E-field from other sources. In some embodiments, the sensor works with single-phase, split-phase, and poly-phase cables. In the case of multiple phases, the measurement is based on the collective E-field. In some embodiments, a coiled flex-circuit electrode allows use of the coiled flex-circuit electrode on cables having a diameter range of 2:1 (largest: smallest cable diameter). The sensor compensates for calculating the dimensions of the electrodes to detect voltage presence when the electrodes may be overlapping due to the overlap of the wrap around the cable. Dimensions accommodate three factors with varying degree of overlap: enough E-field asymmetry between the reference plane and the electrodes, enough electrode area, and increasing air-gap due to the thickness of the material as it wraps around the cable.

Figure 11:
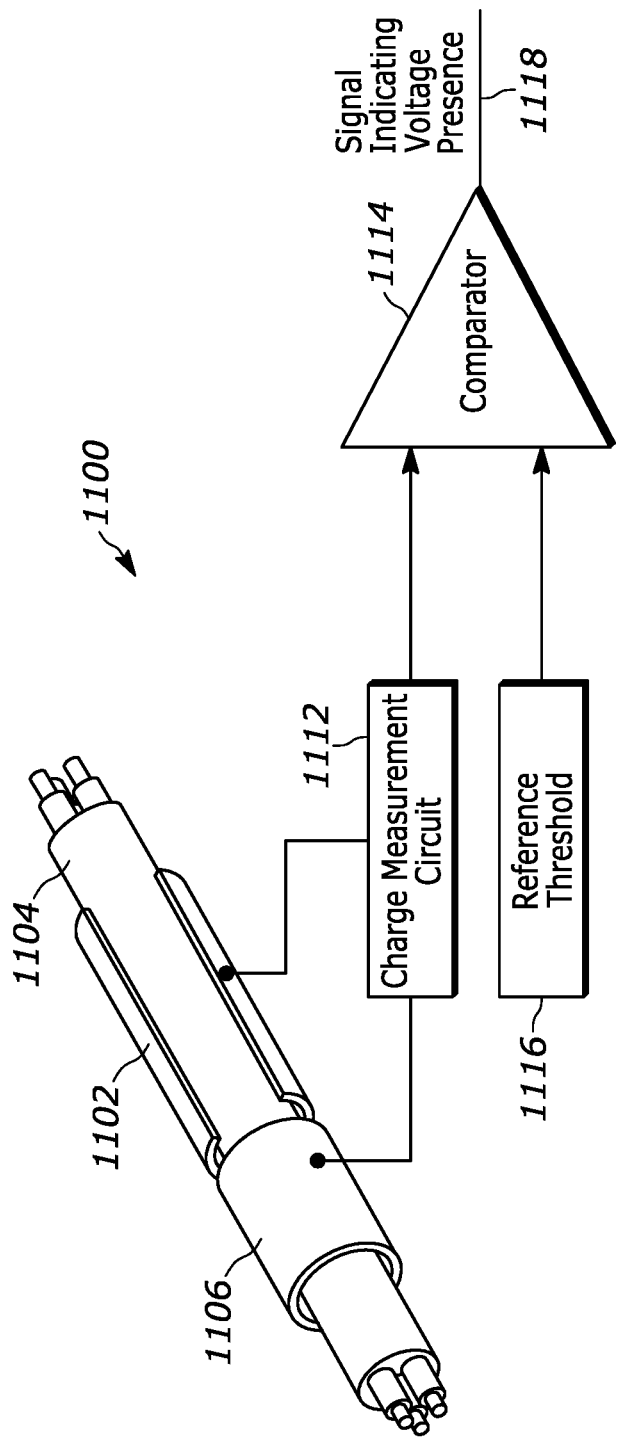
FIG. 11 illustrates an example sensor device for detecting voltage in a conductor cable.

In a first aspect, an example of which is conceptually shown in FIG. 11, a sensor device 1100 for detecting voltage in a conductor cable 1104 includes a sense electrode 1102 to be disposed over a surface of the conductor cable 1104 to cover a sense region having a sense axial width and a sense circumferential length, and a reference electrode 1106 to be disposed over the surface of the conductor cable 1104 to cover a reference region. The reference region has an axial position adjacent the axial position of the sense region and has a reference circumferential length greater than the sense circumferential length. The sensor device 1100 further includes a charge measurement circuit 1112 connected in series between the sense electrode 1102 and the reference electrode 1106 to measure a charge measurement, and circuitry to compare the charge measurement to a threshold to detect a presence of the voltage in the conductor cable. In the example sensor device 1100, such circuitry includes a comparator 1114 for comparing the charge measurement against a reference threshold 1116, and for generating a signal 1118 indicating voltage presence.

In an example of the first aspect the sensor device of claim 1, further comprising a second sense electrode to be disposed over the surface of the conductor cable to cover a second sense region having a second axial width and a second circumferential length, the second sense region having an axial position aligned with the sense region and having a circumferential position adjacent the sense region. In an example, the sense device further includes a second charge measurement circuit connected in series between the second sense electrode and the reference electrode to provide a second charge measurement. In an additional example, the circuitry is to compare the second charge measurement to the threshold to detect the presence of the voltage in the conductor cable. In a further example, the sense electrode and the second sense electrode overlap when disposed over the surface of the conductor cable. In another example, the sensor device further includes a third sense electrode to be disposed over the surface of the conductor cable to cover a third sense region having a third axial width and a third circumferential length, the third sense region having an axial position aligned with the sense region and the second sense region and having a circumferential position adjacent the sense region and the second sense region. In an additional example, the sensor device further includes a third charge measurement circuit connected in series between the third sense electrode and the reference electrode to measure a third charge measurement.

In another example of the first aspect and the above examples, the sensor device further includes a second reference electrode to be disposed over the surface of the conductor cable to cover a second reference region, the second reference region having an axial position adjacent the axial position of the sense region on an opposite axial side of the sense region as the axial position of the reference region and having a second reference circumferential length greater than the sense circumferential length. For example, the second reference electrode is electrically connected to the reference electrode.

In a further example of the first aspect and the above examples, the circuitry is free of a connection to ground.

In an additional example of the first aspect and the above examples, the sensor device is an e-field sensor and wherein the sense and reference electrodes are responsive to the e-field.

In another example of the first aspect and the above examples, the conductor cable includes a line conductor, a neutral conductor, and a ground conductor.

In a further example of the first aspect and the above examples, the conductor cable is a split-phase or three-phase cable.

In an additional example of the first aspect and the above examples, the sensor device further includes an electrostatic discharge structure electrically coupled between the sense electrode and the reference electrode.

In another example of the first aspect and the above examples, the circuitry includes a voltage comparator. For example, the sensor device further includes a fixed reference applied to the voltage comparator.

In a further example of the first aspect and the above examples, the circuitry includes an analog-digital converter and a processor to compare signals.

In an additional example of the first aspect and the above examples, the sense and reference electrodes are disposed in a strap to wrap around the conductor cable. In an example, the circuitry is disposed on a case attached to the strap. In another example, the strap has an adhesive region to secure a portion of the strap to the conductor cable. In a further example, the strap includes a hook region on a first side and a loop region on a second side to form a hook and loop coupling.

In a second aspect, a sensor device for detecting voltage in a conductor cable includes a plurality of sense electrodes to be disposed over the surface of the conductor cable, each sense electrode of the plurality of sense electrodes to cover a unique sense region having an axial length and a circumferential width, the unique region having an axial position aligned with unique sense regions associated with other sense electrodes of the plurality of sense electrodes and having a circumferential position adjacent the unique sense regions associated with other sense electrodes of the plurality of sense electrodes; a reference electrode to be disposed over the surface of the conductor cable to cover a reference region, the reference region having an axial position adjacent the axial position of the unique regions and extending to cover the circumferential positions of the unique regions; a plurality of charge detectors, the each sense electrode of the plurality of sense electrodes electrically connected to the reference electrode through a charge detector of the plurality of charge detectors, the charge detector to detect a charge measurement; and circuitry to compare the charge measurement to a threshold to detect the voltage in the conductor cable.

In an example of the second aspect, the unique region and a second unique region associated with a second sense electrode of the plurality of sense electrode overlap when disposed over the surface of the conductor cable.

In another example of the second aspect and the above examples, the sensor device further includes a second reference electrode to be disposed over the surface of the conductor cable to cover a second reference region, the second reference region having an axial position adjacent the axial position of the unique regions on an opposite axial side of the unique regions as the axial position of the reference region and extending to cover the circumferential positions of the unique regions. For example, the second reference electrode is electrically connected to the reference electrode.

In a further example of the second aspect and the above examples, the circuitry is free of a connection to ground.

In an additional example of the second aspect and the above examples, the sensor device is an e-field sensor and wherein the plurality of sense electrodes and the reference electrode are responsive to the e-field.

In another example of the second aspect and the above examples, the conductor cable includes a line conductor, a neutral conductor, and a ground conductor.

In a further example of the second aspect and the above examples, the conductor cable is a split-phase or three-phase cable.

In an additional example of the second aspect and the above examples, the plurality of sense electrodes and the reference electrode are disposed in a strap to wrap around the conductor cable. For example, the circuitry is disposed on a case attached to the strap. In an example, the strap has an adhesive region to secure a portion of the strap to the conductor cable. In another example, the strap includes a hook region on a first side and a loop region on a second side to form a hook and loop coupling.

In a third aspect, a method for detecting voltage in a conductor cable includes detecting a first signal using a first charge measurement circuit connected in series between a reference electrode and a first electrode, the first electrode disposed over a surface of the conductor cable to cover a first region having a first axial width and a first circumferential length, the reference electrode disposed over the surface of the conductor cable to cover a reference region, the reference region having an axial position adjacent the axial position of the first region and having a reference circumferential length greater than the first circumferential length; and comparing with a circuitry the first signal to a threshold to detect the presence of the voltage in the conductor cable.

In an example of the third aspect, comparing the first signal to a threshold includes applying the voltage to a voltage comparator with a fixed reference.

In another example of the third aspect and the above examples, comparing the first signal to a threshold includes converting the first signal using an analog to digital converter to provide a first digital signal and comparing the first digital signal using a processor.

In a further example of the third aspect and the above examples, comparing includes comparing a peak measurement of the first signal.

In an additional example of the third aspect and the above examples, comparing includes comparing an absolute product of the first signal.

In another example of the third aspect and the above examples, the first electrode and the reference electrode are disposed in a flexible circuitry, the method further comprising wrapping the first electrode and the reference electrode around the conductor cable. For example, wrapping is performed without disconnecting power from the conductor cable.

In a further example of the third aspect and the above examples, the method further includes detecting a second signal using a second charge measurement circuit connected in series between a reference electrode and a second electrode, the second electrode disposed over a surface of the conductor cable to cover a second region having a second axial width and a second circumferential length, the reference region having an axial position adjacent the axial position of the second region and having a reference circumferential length greater than the sum of the first circumferential length and the second circumferential length, the second region offset from the first region along the circumference; and comparing with a circuitry the second signal to a threshold to detect the presence of the voltage in the conductor cable. For example, the method further includes detecting a third signal using a third charge measurement circuit connected in series between a reference electrode and a third electrode, the third electrode disposed over a surface of the conductor cable to cover a third region having a third axial width and a third circumferential length, the reference region having an axial position adjacent the axial position of the third region and having a reference circumferential length greater than the sum of the first circumferential length, the second circumferential length, and the third circumferential length, the third region offset from the first region and the second region along the circumference; and comparing with a circuitry the third signal to a threshold to detect the presence of the voltage in the conductor cable.

In a fourth aspect, a sensor device for detecting voltage in a conductor cable includes a first electrode to be disposed over a surface of the conductor cable to cover a first region having a first axial length and a first circumferential width; a second electrode to be disposed over the surface of the conductor cable to cover a second region having a second axial length and a second circumferential width, the second region having an axial position aligned with the first region and having a circumferential position adjacent the first region; a reference electrode to be disposed over the surface of the conductor cable to cover a reference region, the reference region having an axial position adjacent the axial position of the first and second regions and extending to cover the circumferential positions of the first and second regions; a first charge measurement circuit connected in series between the first electrode and the reference electrode, the first charge measurement circuit providing a first charge measurement; a second charge measurement circuit connected in series between the second electrode and the reference electrode, the second charge measurement circuit providing a second charge measurement; and circuitry to compare the first charge measurement or the second charge measurement to a threshold to detect the voltage in the conductor cable.

In an example of the fourth aspect, the first region and the second region overlap.

In another example of the fourth aspect and the above examples, the sensor device further includes a third electrode to be disposed over the surface of the conductor cable to cover a third region having a third axial length and a third circumferential width, the third region having an axial position aligned with the first and second regions and having a circumferential position adjacent the first and second regions. For example, the reference region extends along the circumferential lengths of at least the first, second, and third regions. In another example, the sensor device further includes a third charge measurement circuit connected in series between the third electrode and the reference electrode, the third ammeter providing a third charge measurement.

In a further example of the fourth aspect and the above examples, the sensor device further includes a second reference electrode to be disposed over the surface of the conductor cable to cover a second reference region, the second reference region having an axial position adjacent the axial position of the first and second regions on an opposite axial side of the first and second regions as the axial position of the reference region and extending to cover the circumferential positions of the first and second regions. For example, the second reference electrode is electrically connected to the reference electrode.

In an additional example of the fourth aspect and the above examples, the circuitry is free of a connection to ground.

In another example of the fourth aspect and the above examples, the sensor device is an e-field sensor and wherein the first, second, and reference electrodes are responsive to the e-field.

In a further example of the fourth aspect and the above examples, the conductor cable includes a line conductor, a neutral conductor, and a ground conductor.

In an additional example of the fourth aspect and the above examples, the conductor cable is a split-phase or three-phase cable.

In another example of the fourth aspect and the above examples, the first, second, and reference electrodes are disposed in a strap to wrap around the conductor cable. For example, the circuitry is disposed on a case attached to the strap. In an example, the strap has an adhesive region to secure a portion of the strap to the conductor cable. In another example, the strap includes a hook region on a first side and a loop region on a second side to form a hook and loop coupling.

In a fifth aspect, a method for detecting voltage in a conductor cable includes detecting a first charge signal using a first charge measurement circuit connected in series between a reference electrode and a first electrode, the first electrode disposed over a surface of the conductor cable to cover a first region having a first axial length and a first circumferential width, a second electrode disposed over the surface of the conductor cable to cover a second region having a second axial length and a second circumferential width, the second region having an axial position aligned with the first region and having a circumferential position adjacent the first region, the reference electrode disposed over the surface of the conductor cable to cover a reference region, the reference region having an axial position adjacent the axial position of the first and second regions and extending to cover the circumferential positions of the first and second regions; detecting a second charge signal using a second charge measurement circuit connected in series between the second electrode and the reference electrode; and comparing with a circuitry the first charge signal or the second charge signal to a threshold to detect the voltage in the conductor cable.

In an example, the method further includes detecting a third charge signal with a third charge measurement circuit connected in series between the reference electrode and a third electrode, the third electrode disposed over the surface of the conductor cable to cover a third region having a third axial length and a third circumferential width, the third region having an axial position aligned with the first and second regions and having a circumferential position adjacent the first and second regions.

Note that not all of the activities described above in the general description or the examples are required, that a portion of a specific activity may not be required, and that one or more further activities may be performed in addition to those described. Still further, the order in which activities are listed are not necessarily the order in which they are performed.

In the foregoing specification, the concepts have been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

As used herein, the terms "comprises," "comprising," "includes," "including," "has," "having" or any other variation thereof, are intended to cover a non-exclusive inclusion. For example, a process, method, article, or apparatus that comprises a list of features is not necessarily limited only to those features but may include other features not expressly listed or inherent to such process, method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" are employed to describe elements and components described herein. This is done merely for convenience and to give a general sense of the scope of the invention. This description should be read to include one or at least one and the singular also includes the plural unless it is obvious that it is meant otherwise.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

After reading the specification, skilled artisans will appreciate that certain features are, for clarity, described herein in the context of separate embodiments, may also be provided in combination in a single embodiment. Conversely, various features that are, for brevity, described in the context of a single embodiment, may also be provided separately or in any subcombination. Further, references to values stated in ranges include each and every value within that range.

What is claimed is:

1. A sensor device for detecting voltage in a conductor cable, the sensor device comprising:
a sense electrode to be disposed over a surface of the conductor cable to cover a sense region having a sense axial width and a sense circumferential length;
a reference electrode to be disposed over the surface of the conductor cable to cover a reference region, the reference region having an axial position adjacent the axial position of the sense region and having a reference circumferential length greater than the sense circumferential length;
a charge measurement circuit connected in series between the sense electrode and the reference electrode to measure a charge measurement; and
circuitry to compare the charge measurement to a threshold to detect a presence of the voltage in the conductor cable.

2. The sensor device of claim 1, further comprising a second sense electrode to be disposed over the surface of the conductor cable to cover a second sense region having a second axial width and a second circumferential length, the second sense region having an axial position aligned with the sense region and having a circumferential position adjacent the sense region.

3. The sensor device of claim 2, further comprising a second charge measurement circuit connected in series between the second sense electrode and the reference electrode to provide a second charge measurement.

4. The sensor device of claim 3, wherein the circuitry is to compare the second charge measurement to the threshold to detect the presence of the voltage in the conductor cable.

5. The sensor device of claim 2, wherein the sense electrode and the second sense electrode overlap when disposed over the surface of the conductor cable.

6. The sensor device of claim 2, further comprising a third sense electrode to be disposed over the surface of the conductor cable to cover a third sense region having a third axial width and a third circumferential length, the third sense region having an axial position aligned with the sense region and the second sense region and having a circumferential position adjacent the sense region and the second sense region.

7. The sensor device of claim 6, further comprising a third charge measurement circuit connected in series between the third sense electrode and the reference electrode to measure a third charge measurement.

8. The sensor device of claim 1, further comprising a second reference electrode to be disposed over the surface of the conductor cable to cover a second reference region, the second reference region having an axial position adjacent the axial position of the sense region on an opposite axial side of the sense region as the axial position of the reference region and having a second reference circumferential length greater than the sense circumferential length.

9. The sensor device of claim 8, wherein the second reference electrode is electrically connected to the reference electrode.

10. The sensor device of claim 1, wherein the circuitry is free of a connection to ground.

11. The sensor device of claim 1, wherein the sensor device is an e-field sensor and wherein the sense and reference electrodes are responsive to the e-field.

12. The sensor device of claim 1, wherein the conductor cable includes a line conductor, a neutral conductor, and a ground conductor.

13. The sensor device of claim 1, wherein the conductor cable is a split-phase or three-phase cable.

14. The sensor device of claim 1, further comprising an electrostatic discharge structure electrically coupled between the sense electrode and the reference electrode.

15. The sensor device of claim 1, wherein the circuitry includes a voltage comparator.

16. The sensor device of claim 15, further including a fixed reference applied to the voltage comparator.

17. The sensor device of claim 1, wherein the circuitry includes an analog-digital converter and a processor to compare signals.

18. The sensor device of claim 1, wherein the sense and reference electrodes are disposed in a strap to wrap around the conductor cable.

19. The sensor device of claim 18, wherein the circuitry is disposed on a case attached to the strap.

20. The sensor device of claim 18, wherein the strap has an adhesive region to secure a portion of the strap to the conductor cable.

21. The sensor device of claim 18, wherein the strap includes a hook region on a first side and a loop region on a second side to form a hook and loop coupling.

* * * * *